United States Patent [19]

Peterson

[11] Patent Number: 5,394,002
[45] Date of Patent: Feb. 28, 1995

[54] ERASABLE PROGRAMMABLE MEMORY

[75] Inventor: James L. Peterson, Richardson, Tex.

[73] Assignee: Texas Instruments Incorporated, Dallas, Tex.

[21] Appl. No.: 149,148

[22] Filed: Nov. 5, 1993

Related U.S. Application Data

[63] Continuation of Ser. No. 697,536, Apr. 30, 1991, abandoned, which is a continuation of Ser. No. 531,987, Jun. 1, 1990, abandoned.

[51] Int. Cl.⁶ .................................... H01L 29/788
[52] U.S. Cl. ................. 257/321; 257/315; 257/317
[58] Field of Search ............ 357/23.5; 365/185; 257/315, 316, 317, 321

[56] References Cited

U.S. PATENT DOCUMENTS

| | | | |
|---|---|---|---|
| 4,590,504 | 5/1986 | Guterman | 257/321 |
| 4,750,024 | 6/1988 | Schreck | 357/23.5 |
| 4,853,895 | 8/1989 | Mitchell et al. | 365/185 |
| 4,855,800 | 8/1989 | Esquivel et al. | 365/185 |
| 4,912,676 | 3/1990 | Paterson et al. | 357/23.5 |
| 4,924,437 | 5/1990 | Paterson et al. | 357/23.5 |
| 4,935,791 | 6/1990 | Namaki et al. | 357/23.5 |
| 5,017,980 | 5/1991 | Gill et al. | 257/321 |

Primary Examiner—William L. Sikes
Assistant Examiner—Hung Xuan Dang
Attorney, Agent, or Firm—Ira S. Matsil; James C. Kesterson; Richard L. Donaldson

[57] ABSTRACT

According to the invention, an electrically-erasable, electrically programmable read-only memory cell is formed at the face of a semiconductor layer 321 of a first conductivity type. A source region 311 and a drain region 312 are formed at the face of semiconductor layer 321 to be of a second conductivity type opposite the first conductivity type. Source region 311 and drain region 312 are spaced by a channel 313. A tunneling oxide window 327 is formed adjacent source region 311. A floating gate 314 is formed insulatively adjacent the entire length of channel 313 between source region 311 and drain region 312. Floating gate 314 is also formed directly adjacent tunneling oxide window 327. A control gate 315 is disposed 15 insulatively adjacent floating gate 314.

23 Claims, 7 Drawing Sheets

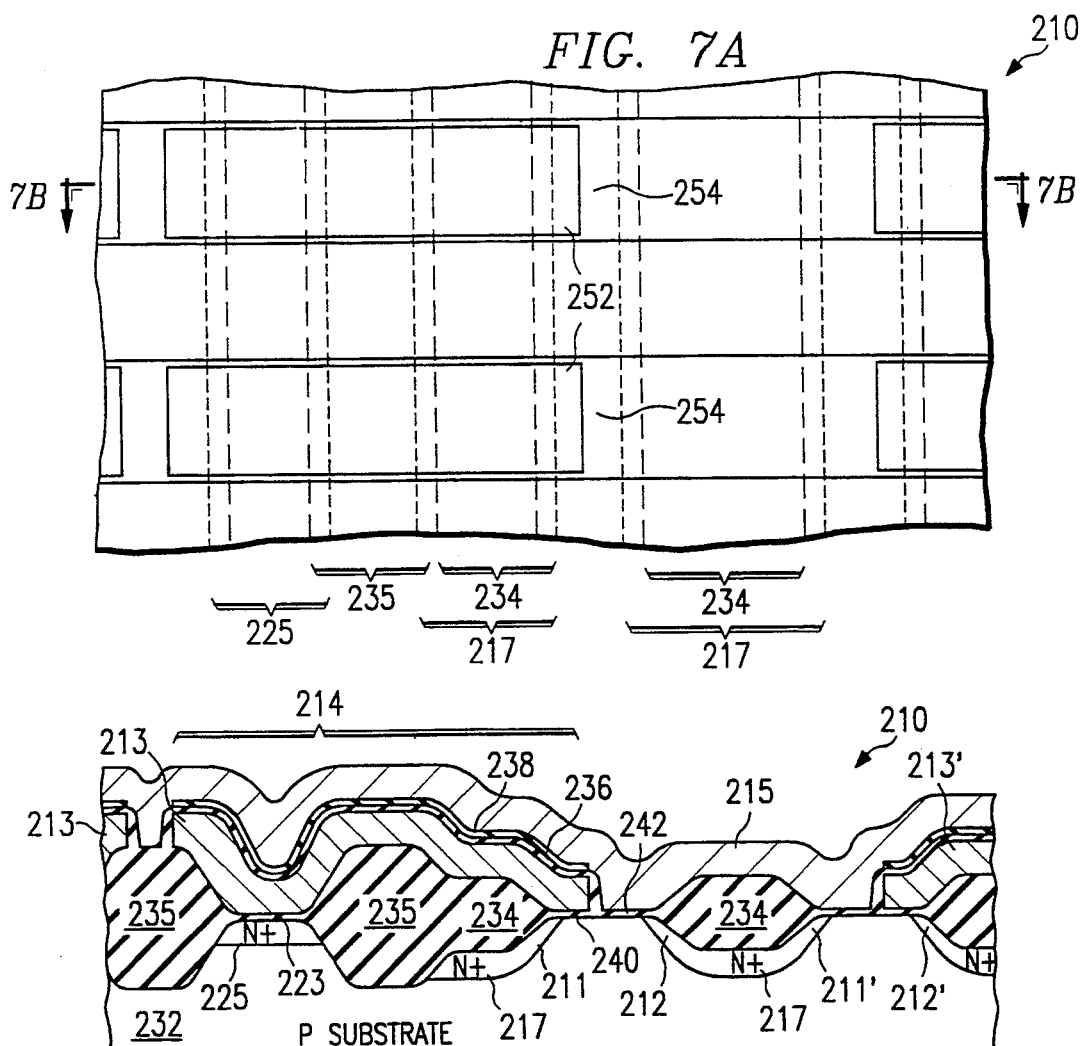
FIG. 7A
FIG. 7B
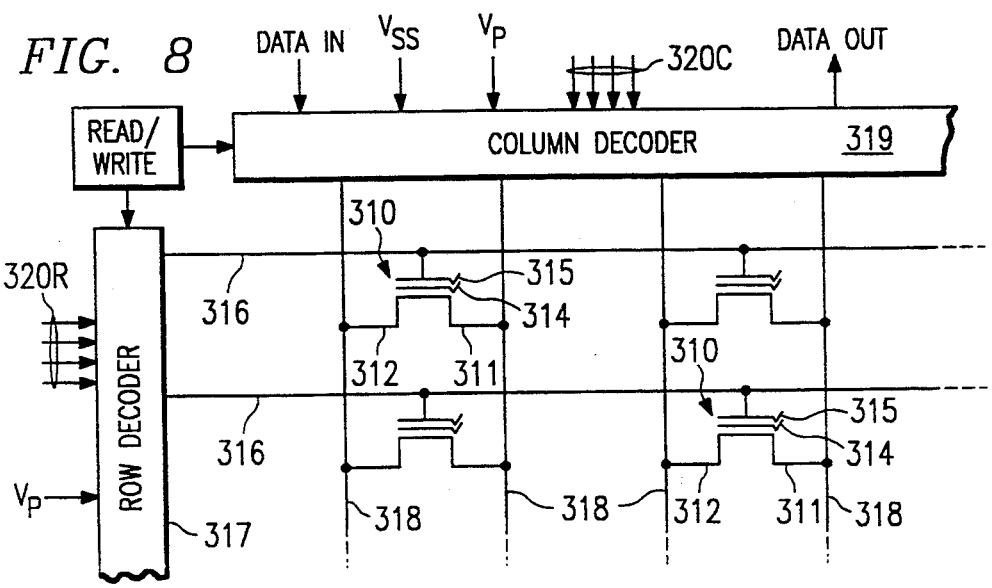
FIG. 8

ERASABLE PROGRAMMABLE MEMORY

This application is a continuation of application Ser. No. 07/697,536, filed Apr. 30, 1991, now abandoned, which is a continuation of Ser. No. 07/531,987, filed Jun. 1, 1990, now abandoned.

TECHNICAL FIELD OF THE INVENTION

The present invention relates to electronic semiconductor devices, and, more particularly, to erasable programmable memory devices and methods of fabrication.

BACKGROUND OF THE INVENTION

Non-volatile semiconductor memory devices based on metal-oxide-semiconductor field effect transistors (MOSFETs) were first proposed in 1967 (see Sze, "Physics of Semiconductor Devices" (*Wiley-Interscience*, pages 496–506, 2d Ed. 1981). These devices store a bit of information as the presence or absence of a quantity of electrical charge on a floating gate that is located so that the charge affects the threshold voltage of a MOSFET. Currently, MOSFET non-volatile memory devices include EPROMs, EEPROMs and Flash EEPROMs. EPROM (erasable programmable read only memory) cells store a bit of information as a quantity of electrons on a floating gate; the electrons are avalanche-injected into the floating gate from the drain end of the cell transistor channel and are erased for all cells simultaneously by photoemission under ultraviolet irradiation. The Floating gate Avalanche-injection MOS transistor is typically called a FAMOS transistor. The density of EPROMs had reached 1 megabite by 1984, but the inconvenience of the ultraviolet erase has led to the development of EEPROMs and Flash EEPROMs.

EEPROMs (electrically-erasable programmable read-only memories) both program and erase information for a single memory cell by tunneling charges through insulators: the FLOTOX version uses a floating gate as with an EPROM but with a thin tunneling oxide between the floating gate and the transistor drain; the textured poly version uses tunneling between three polysilicon gates with one of the gates a floating gate; and the MNOS version uses a stacked oxide and nitride gate insulators and stores charges in traps in the nitride and programs and erases by tunneling through the oxide to the channel region. See generally, S. Lai et al., "Comparison and Trends in Today's Dominant $E^2$ Technologies," *IEDM Tech Digest*, p. 580 (1986).

Flash EEPROMs are hybrids that program in the manner of either EPROMs (avalanche-injection) or EEPROMs (tunneling) and erase in the manner of EEPROMs (tunneling) but with the erasure generally limited to bulk electrical erasure of the entire memory analogous to the ultraviolet light erasure of an EPROM.

The trend to larger scale integration has demanded small, highly packed memory cells with low power dissipation, and the desire for flexibility of multiple reprogramming has demanded durable tunneling oxides. Consequently, many variations of the basic EPROM, EEPROM and Flash EEPROM cells have been introduced. For example, McElroy, U.S. Pat. No. 4,373,248, shows EPROM cells in an array with a set of parallel continuous buried n+ diffusion lines in a silicon substrate acting as sources and drains (bitlines) for the floating gate cells with a second set of parallel continuous polysilicon lines over the floating gates acting as control gates (wordlines); the polysilicon lines are perpendicular to the buried diffusion lines. The disclosures of J. Esquivel et al., "High Density Contactless, Self-Aligned EPROM Cell Array Technology," 1986 *IEDM Tech. Dig.* 592, Mitchell, U.S. Pat. No. 4,597,060 and Sugiura et al., U.S. Pat. No. 4,451,904 also show buried bitlines and perpendicular polysilicon wordlines in an EPROM array.

Miyamoto, U.S. Pat. No. 4,642,673, discloses a floating gate EEPROM cell array with parallel continuous buried diffusion lines acting as control gates and each cell has a floating gate transistor plus a select transistor in series with the floating gate extending over a diffusion line; the source/drain contacts are to metal lines (bitlines and source lines) perpendicular to the diffusion lines, and gates for the select transistors are polysilicon lines (wordlines) parallel to the diffusion lines. Note that the series select transistor is added to avoid the case of an over-erased floating gate transistor going into depletion mode and conducting even with no voltage applied to the control gate.

D. Guterman, U.S. Pat. No. 4,590,504 discloses an EEPROM array with each cell having a buried source region connected to a buried ground line and a buried drain region including a remote drain portion for tunneling into the floating gate connected to a metal bitline plus parallel polysilicon control gate line and select transistor gate line.

F. Masuoka et al., "A 256K Flash EEPROM Using Triple Polysilicon Technology, 1985 *ISSCC Technical Dig.* 168, discloses a Flash EEPROM cell array with first level polysilicon erase lines, second level polysilicon floating gates and third level control gate lines (wordlines); the floating gate transistor and the select transistor are merged by having the floating gate over only a portion of the channel region. The transistor source connects to a diffusion line and the drain connects to a metal line over the polysilicon lines; the diffusion lines and the wordlines are parallel, and the erase lines and the metal lines are parallel and are perpendicular to the diffusion lines and wordlines. The floating gate is programmed by avalanche-injection as in an EPROM, and erasure of the floating gate is by tunneling to the adjacent erase line.

However, the known EEROMs and Flash EEPROMs have problems of large cell size limiting packing density, isolation and programmability for dense arrays of cells and complex processing.

SUMMARY OF THE INVENTION

According to the invention, an electrically-erasable, electrically-programmable, read-only memory cell is formed at the face of a layer of semiconductor of a first conductivity type. A source region and a drain region, each of a second conductivity type opposite the first conductivity type, are formed at the face to be spaced by a channel area. A tunneling oxide window is formed adjacent the source region. A floating gate conductor is formed insulatively adjacent a channel in the channel area and spans the entire channel length between the source region and the drain region. A control gate conductor is formed insulatively adjacent the floating gate conductor. In a preferred method of fabricating the present invention, differentially grown oxide regions are formed over the source and drain regions while thick insulating oxides are grown adjacent the source and drain regions remote from the channel area. A tunneling oxide window is then disposed between the differentially grown oxide overlying the source region and the thick isolating oxide adjacent the source region.

The present invention allows for a smaller cell since the select transistor found in a merged transistor cell has been eliminated. The floating gate completely overlies and controls the channel area rather than sharing control over the channel with the control gate as in a merged transistor cell. The preferred method of fabrication of the present invention allows for formation of a sub-microlithographic tunneling window with precisely defined dimensions without the need for critically aligned masking techniques.

BRIEF DESCRIPTION OF THE DRAWINGS

For a more -complete understanding of the present invention, and the advantages thereof, reference is now made to the following descriptions taken in conjunction with the accompanying drawings, in which:

FIGS. 7a-7b are plan and cross sectional elevation views of a third preferred embodiment cell; and FIG. 8 is an electrical schematic of a portion of a fourth preferred embodiment EEPROM;

FIG. 8b is a schematic cross sectional view taken substantially along line 8b—8b of FIG. 8a.

DETAILED DESCRIPTION OF THE INVENTION

The preferred embodiment of the present invention is best understood by referring to FIGS. 1 through 8e of the drawings, like numerals being used for like and corresponding parts of the various drawings.

Figure 1:
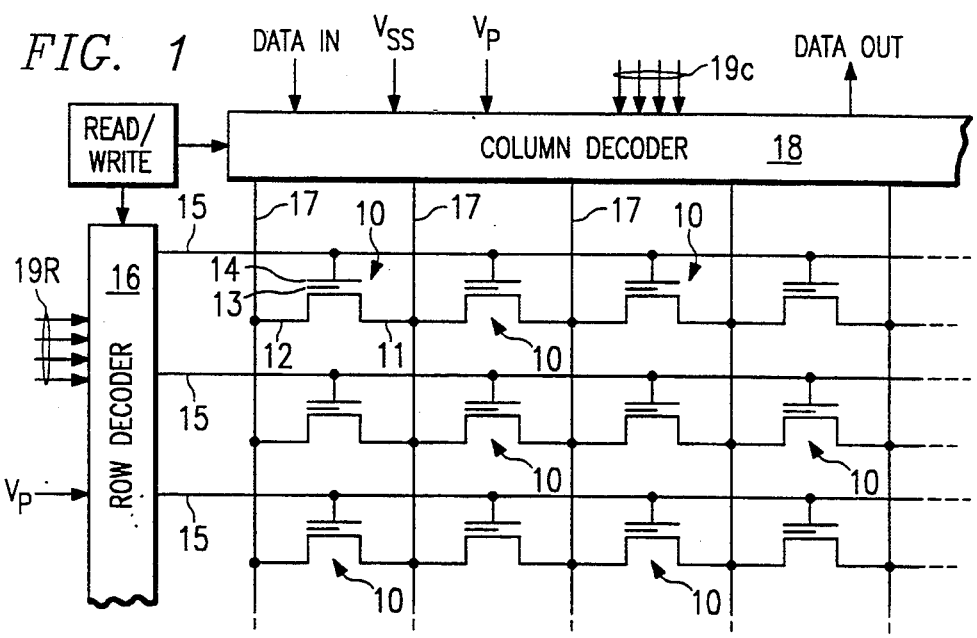
FIG. 1 is a plan view of a portion of an EEPROM according to a first embodiment of the invention, in the plan views in general, dashed lines indicate structures concealed by those structures indicated by solid lines, while striped structures are those structures concealed by at least both the structures indicated by the dashed and the solid lines.

FIG. 1 is a schematic plan view of a first preferred embodiment EEPROM illustrating a portion of the array of memory cells and peripheral devices; the full array may have over a million cells and be fabricated on a silicon substrate of size about 60 square millimeters. Each cell is a floating gate n channel MOSFET 10 having a source 11, a drain 12, a floating gate 13, and a control gate 14. A bit of information is stored in cell 10 by net charge on floating gate 13: with no net charge or a net positive charge on floating gate 13 the threshold voltage for cell 10 is low, and with a substantial net negative charge on floating gate 13 the threshold voltage is high. The threshold voltage of cell 10 is determined to be high or low simply by applying a control gate voltage (which is between the high and low threshold voltages) and sensing the transistor channel impedance. The erased state for a cell is taken to be state with a high threshold voltage (substantial net negative charge on floating gate 13), and the programmed state is taken to be the state with a low threshold voltage.

All of the gates 14 in a row of cells are connected to a row address line (wordline) 15, and all of the wordlines 15 are connected to a row decoder 16. All of the source and drain electrodes 11 or 12 in a column of cells are connected to a column line (bitline) 17, and the source and drain bitlines 17 are connected to a column decoder 18. The operation of the first preferred embodiment will be considered in detail in connection with the description of the individual cells infra; however, the following cursory description of the operation provides a convenient overview. To read a selected cell, column decoder 18 applies about +3 volts to the bitline 17 connected to drain 12 of the selected cell and 0 volts to all other bitlines 17, and row decoder 16 applies about +5 volts to the wordline 15 connected to control gate 14 of the selected cell and about 0 volts to all other wordlines 15; thus, all cells except the selected cell are turned off regardless of any net charges on their floating gates and the selected cell is turned on or off depending upon the net charge on floating gate 13. Thus, the impedance seen by column decoder 18 between the bitline 17 connected to the source of the selected cell and the bitline 17 connected to the drain of the selected cell indicates the bit of information stored by the selected cell. Signals on input lines 19C determine the bitlines 17 selection and signals on input lines 19R determine the wordline 15 selection.

In the block erase mode, column decoder 18 applies a voltage of about 0 volts to all bitlines 17. To erase the row of cells or block of cells which includes cell 10, row decoder 16 applies a voltage pulse of about +13 volts to the wordline 15 connected to control gate 14 of the selected row and about 0 volts to all other wordlines 15. This causes tunneling of electrons from drain 12 into floating gate 13 for each cell in the row and results in a block erase. Of course, all rows can be simultaneously erased by applying the voltage pulse to all wordlines and this yields a bulk erase. In the program mode, column decoder 18 applies a voltage of about +5 volts to the bitline 17 connected to the drain of the selected cell and about 0 volts to all other bitlines 17. To perform the programming, row decoder 16 applies a voltage pulse of about −8 volts to the wordline 15 connected to the control gate 14 of the selected cell and about 0 volts to all wordlines 15. Electrons tunnel out of floating gate 13 into drain 12 for the selected cell.

Figure 2A:
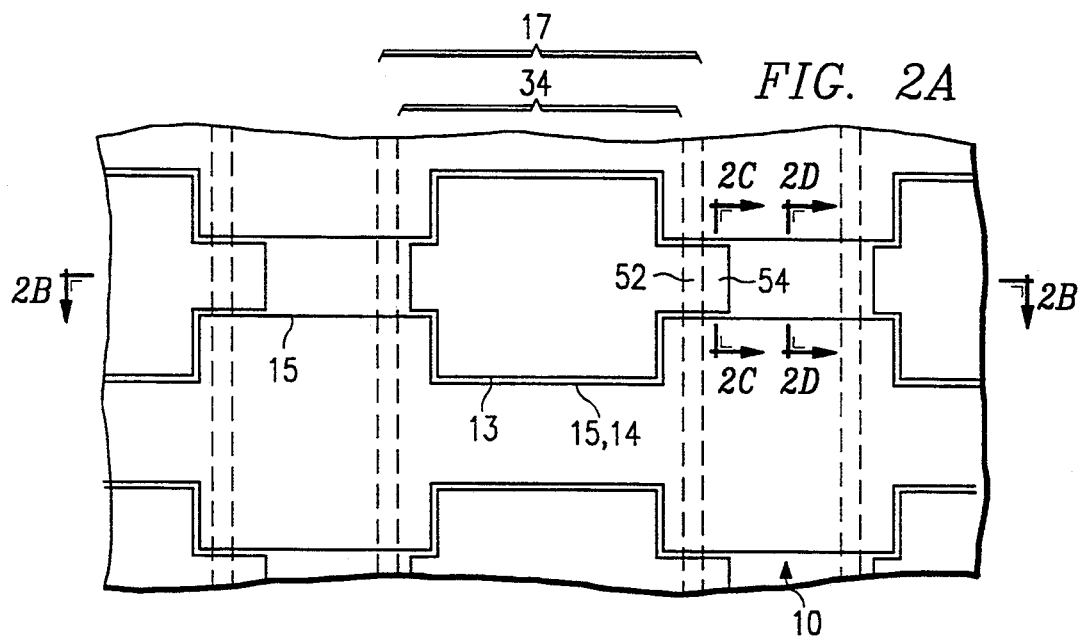
FIGS. 2a-2d are plan and cross-sectional elevation views of the first preferred embodiment cell.
Figure 2B:
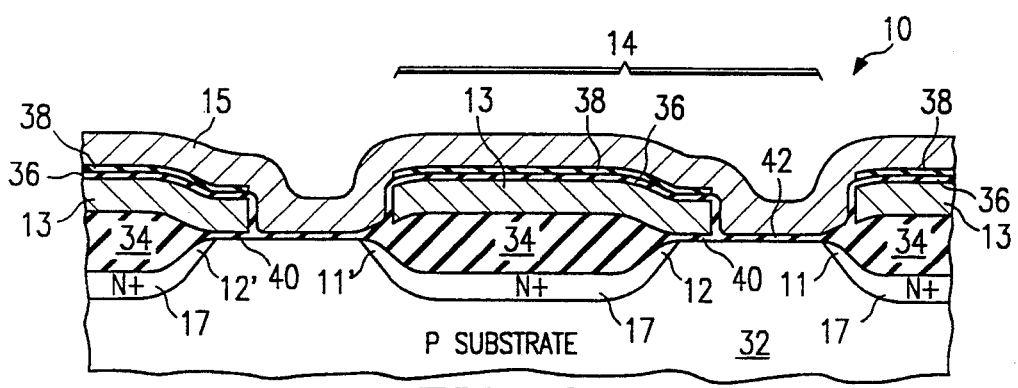
Figure 2C:
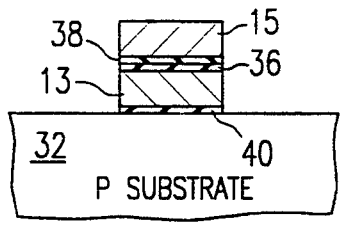
Figure 2D:
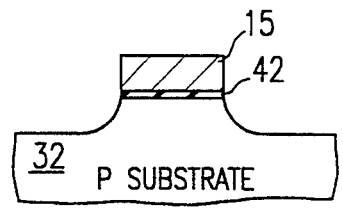
Figure 3A:
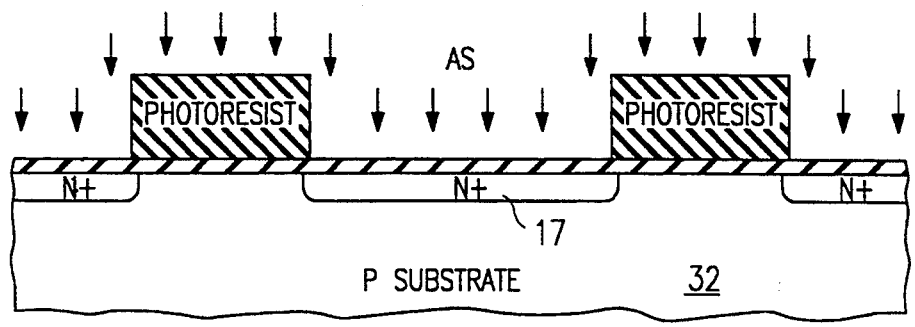
FIGS. 3a-3f illustrate a first preferred embodiment method of fabrication of the first preferred embodiment cell.
Figure 3B:
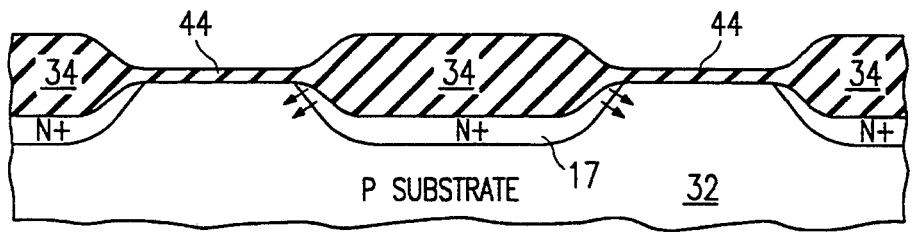
Figure 3C:
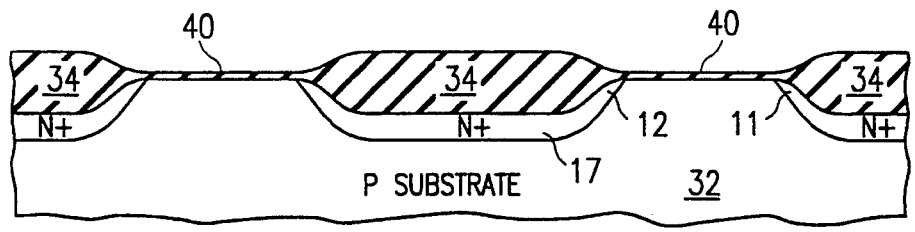
Figure 3D:
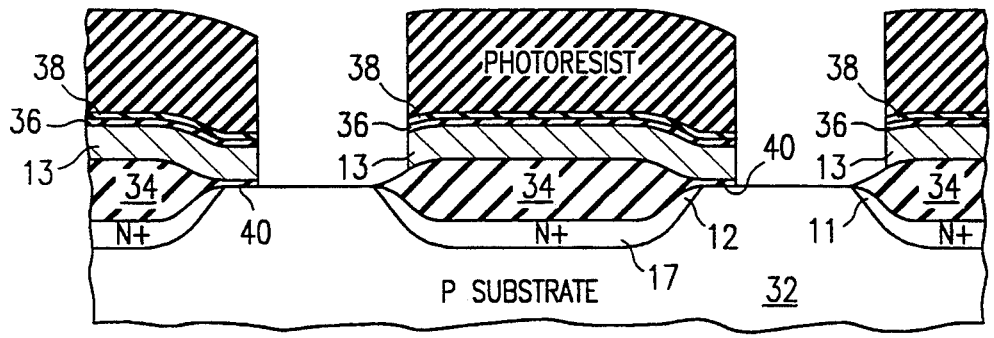
Figure 3E:
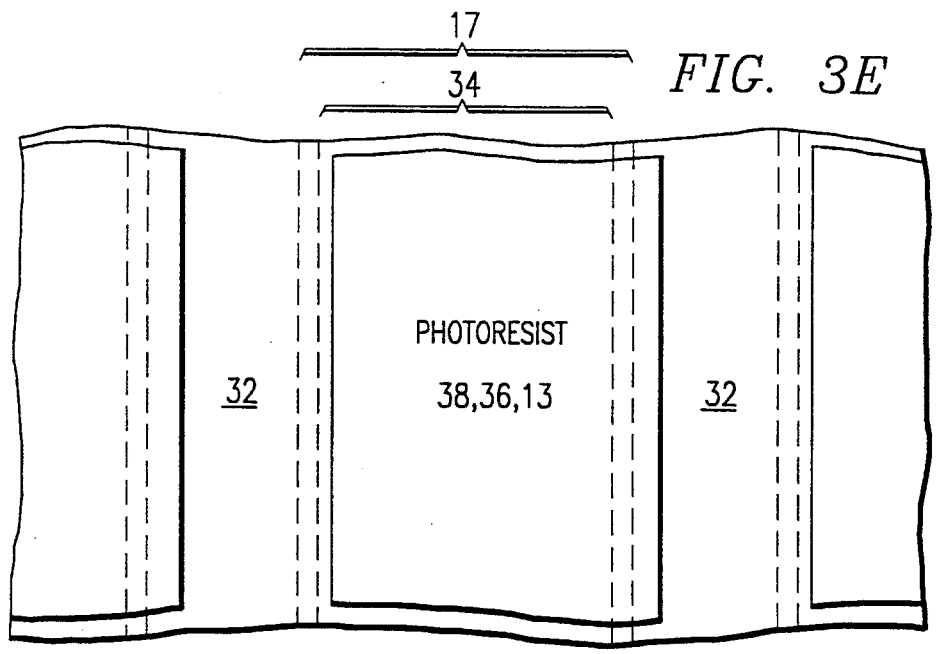
Figure 3F:
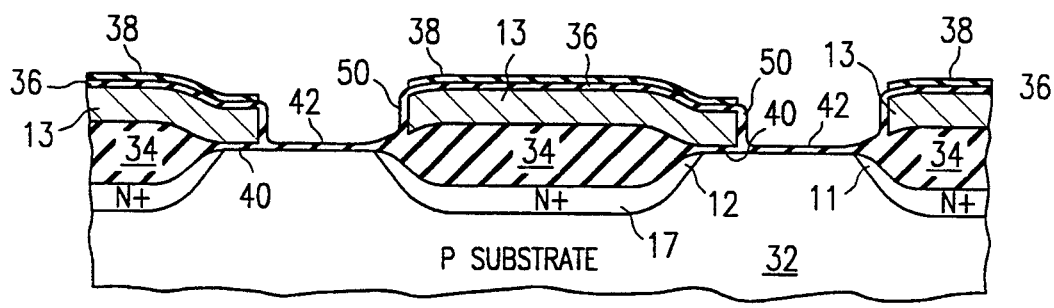

FIGS. 2a-2d are schematic plan and cross-sectional elevation views of an individual cell, generally denoted 10, in the first preferred embodiment; passivation, contacts, interconnections, metallizations, and packaging have been omitted for clarity. Cell 10 includes p type <100> oriented silicon substrate 32 buried n+ bitlines 17 which provide source 11 and drain 12, field oxide (silicon dioxide) 34, n+ doped polysilicon (polycrystalline silicon) floating gate 13, interlevel oxide 36, interlevel nitride (silicon nitride) 38, n+ dopant polysilicon wordline 15 which provides control gate 14 as indicated in FIG. 2b, first gate oxide 40, and second gate oxide 42. As is apparent from FIG. 2a, cell 10 is a cross-point cell (the cell is at the cross-point of a bitline and a wordline) and has the following dimensions expressed in terms of a scalable length $\lambda$: The channel region between source 11 and drain 12 has width $\lambda$ and length $2\lambda$, buried bitlines have width $3\lambda$, floating gate 13 has width (vertical distance in FIG. 2a) $3\lambda$ and is separated from the adjacent floating gate by $\lambda$, the widest portion of floating gate 13 has length $2\lambda$, the area 52 of the overlap of floating gate 13 on drain region 12 is about $(\frac{1}{3})(\lambda^2)$, the area 54 of the overlap of floating gate 13 on the channel region is also about $(\frac{1}{3})(\lambda^2)$, and the total area of floating gate 13 is about $7\lambda^2$. Thus, cell 10 occupies about $20\lambda^2$. Typically, $\lambda$ would equal about 1 $\mu$m for a 1 Megabit EEPROM, and the oxide and nitride thicknesses described infra are convenient for such $\lambda$.

The operation of cell 10 is as follows with voltages given under the presumption of oxide and nitride thicknesses of 100 Å for first gate oxide 40 and 200 Å for both interlevel oxide 36 and nitride 38 and 400 Å for second gate oxide 42. The region between source 11 and drain 12 comprises a merged transistor with control gate 14 over floating gate 13 on first gate oxide 40 forming a floating gate transistor and with control gate 14 on second gate oxide 42 forming a select transistor in series with the floating gate transistor. The transistors have their threshold voltage (with no net charge on floating gate 13) adjusted to about 0.75 volt. Information in cell 10 is stored in terms of whether the merged transistor is turned on by a control gate voltage of 5 volts; the applied drain voltage is 3 volts. If floating gate 13 has a negative net charge sufficient to raise the threshold of the floating gate transistor to above 5 volts, then a control gate voltage of 5 volts is insufficient to turn on the merged transistor; whereas, if floating gate 13 has minimal net charge, then a control gate voltage of 5 volts turns on both transistors. Contrarily, if the control gate voltage is about 0 volts, then the select transistor is off; this compensates for any over programming of the floating gate transistor which could lower the threshold voltage to below 0 (depletion mode).

Cell 10 is erased (put negative net charge on floating gate 13) by tunneling electrons from drain 12 into floating gate 13 under the conditions of $+13$ volts on wordline 15 which includes control gate 14, 0 volts on all other wordlines or wordline segments, 0 volts on bitline 17 which includes drain 12, and $+5$ volts on all other bitlines. The tunneling is driven by the initial potential drop of about $-10$ volts across the thin oxide (100 Å at the drain edge) from drain 12 to floating gate 13. Other cells in the same row are not erased because the $+5$ volts on all other bitlines implies the potential drop from drain to floating gate is only about $-5$ volts for such cells; and all other cells in different rows are not programmed because the control gate voltage is 0 volts.

Cell 10 is programmed (reduce net charge on floating gate 13 to minimal levels) by tunneling electrons from floating gate 13 to drain 12 under the conditions $-8$ volts on wordline 15 which includes control gate 14, 0 volts on all other wordlines, $+5$ volts on bitline 17 which includes drain 12, and 0 volts on all other bitlines. Again, the tunneling is driven by the initial potential drop of about $+10$ volts across the thin oxide from drain 12 to floating gate 13. Other cells in the same row are not programmed because the 0 volts on all other bitlines implies the potential drop from drain to floating gate is only about $+5$ volts for such cells; and all other cells in different rows are not programmed because the control gate voltage is 0 volts.

The voltages required for programming and erasing cell 10 depend upon the relative capacitive couplings and the applied biases. Floating gate 13 is an equipotential body, and the capacitive coupling between floating gate 13 and another element of cell 10 may be approximated by their area of overlap divided by the distance of separation and multiplied by the permitivity of the separation material. The capacitances involving floating gate 13 are:

| Paired Element | Overlap Area ($\lambda^2$) | Effective Separation | Relative Capacitance |
| --- | --- | --- | --- |
| Drain 12 | 0.33 | 100 Å | 1 |
| Substrate 32 | 0.33 | 100 Å | 1 |
| Control gate 14 | 7 | 300 Å | 7 |
| Bitline 17 | 6.33 | 4000 Å | 0.47 | where the floating gate 13/bitline 17 capacitance is for the portion of bitline 17 under oxide 34 and the floating gate 13/drain 12 capacitance is for the drain 12 portion of bitline 17 under first gate oxide 40. The potential, $V_0$, of floating gate 13 under a set of biases on the other four elements is simply derived from:

$$C_0 V_0 = Q_{net} + C_{FD} V + C_{FS} V_S + C_{FC} V_C + C_{FB} V_B,$$

which expresses the net charge $Q_{net}$ on floating gate 13 in terms of the capacitances between floating gate 13 and each of the other four elements and the potentials of each of the other four elements plus the total capacitance ($C_0$) and the potential ($V_0$) for floating gate 13. Of course, Qnet and $V_0$ vary with time during programming and erasing, and a solution taking into account time variance would include integrating the Fowler-Nordheim tunneling current over time with the tunneling current depending upon $V_0 - V_D$. The ratio of $C_{FC}$ to $C_{FD}$ is about 7, and this implies that about 85% of the potential difference between control gate 14 and drain 12 appears across first gate oxide 40. Thus, only 13 volts between control gate 14 and drain 12 are needed to have about 10 volts across first gate oxide 40 for efficient tunneling because this represents an electric field of about 10MV/cm for the 100 Å thick first gate oxide 40. The location of floating gate 13 and control gate 14 over oxide 34 provides large overlap area within a compact cross point design for cell 10; and the formation of drain 12 by diffusion of dopants during formation of oxide 34 yields a small overlap area of the drain 12 to floating gate 13 (the length of drain 12 is sub-photolithographic). These factors provide the large ratio of capacitive couplings which permits low voltages to be used for programming and erasing. Note that the area of cell 10 could be reduced to $5\lambda \times 3\lambda = 15\lambda^2$ by eliminating the lateral (vertical in FIG. 2a) bulge in the polysilicon, but this would lessen the capacitive coupling ratio and require increased voltages for programming and erasing.

During erasing of cell 10 control gate 14 is at about 13 volts and drain 12 at about 0 volts. However, bitline 17, which includes drain 12, also is operable as source 11' of the adjacent merged transistor in the same row using the same wordline 15 (see FIG. 2b). If drain 12' of the adjacent merged transistor is biased at about 5 volts, current will flow in the adjacent merged transistor and hot electrons at drain 12' may be unintentionally injected into floating gate 13' (note that the floating gate 13' to drain 12' voltage is too low for tunneling) and erase floating gate 13'. This possibility may be avoided by erasing in blocks of rows, i.e., page mode erasure.

Further understanding of the first preferred embodiment arises from consideration of a first preferred embodiment method of fabrication including the following steps illustrated in schematic cross sectional elevation views in FIG. 3a–3f:

(a) Grow pad oxide to a thickness of about 350 Å on p type, <100> oriented silicon substrate 32; then spin on photoresist and pattern it to define buried bitlines 17. Implant a dose of $8 \times 10^{15}/cm^2$ of arsenic at 150 keV through the pad oxide using the patterned photoresist as the implant mask; see FIG. 3a. The projected range for this implant is about 800 Å, so the peak concentration is about 500 Å into the silicon.

(b) Strip the photoresist and the pad oxide. Grow self-aligned thick oxide 34 over the bitlines 17 at 900° C.; the heavily arsenic doped silicon (bitlines 17) differentially oxidizes in steam at about eight times the rate of lightly doped p type silicon 32. Thus, growing oxide 34 to a thickness of 4,000 Å only results in 500 Å of oxide 44 over the undoped silicon. Further, the implanted arsenic segregates into the silicon during oxidation, so the arsenic accumulates preferentially in front of the advancing oxide/silicon interface. See FIG. 3b which also shows the effect of lateral diffusion of the arsenic (indicated by the arrows) which keeps bitlines 17 abutting oxide 44; the lateral diffusion will provide the source 11 and drain 12 regions for the cells 10.

(c) Etch oxides 34 and 44 to remove 500 Å plus a 20% overetch to compensate for non-uniformities. This removes all of oxide 44 and leaves oxide 34 of thickness about 3,400 Å. The etch may be a wet etch with HF or a plasma etch with $CF_4$. Next grow first gate oxide 40 to a thickness of 100 Å over silicon 32. The thickness of oxide 40 over source 11 and drain 12 will vary continuously from 100 Å at the boundary of source 11 and drain 12 with the remainder of substrate 32 to 800 Å at the interface with oxide 34; of course, this variance is due to the more rapid oxidation of arsenic doped silicon plus the further lateral diffusion of the arsenic. The growth will increase the thickness oxide 34 to about 4,000 Å; see FIG. 3c. Note that this step (c) could be avoided by growing the oxide in step (b) at a lower temperature (800° C.) to increase the preferential oxidation rate ratio to about eleven to one plus use a thicker first gate oxide, for example, 200 Å thick first gate oxide and 2,200 Å thick field oxide. Such a thicker first gate oxide would require different voltages for the programming and erasure tunneling, and such a thinner field oxide would increase the capacitive coupling of the floating gate to the bitline.

(d) Deposit first level polysilicon to a thickness 3,000 Å by LPCVD (low pressure chemical vapor deposition), and implant or diffuse phosphorus to dope the polysilicon n+. Deposit or grow interlevel oxide to a thickness of 200 Å and deposit interlevel nitride to a thickness of 200 Å, each deposition done by LPCVD. Spin on photoresist and pattern it to define just the edges of floating gate 13 parallel to the bitlines 17; and use the patterned photoresist as an etch mask to anisotropically etch the nitride, oxide and polysilicon with a plasma of $CF_4$ to form the precursor of floating gate 13 with capping oxide 36 and nitride 38. See FIG. 3d for the cross sectional elevation view and FIG. 3e for the plan view; note that the plasma etch also removes a portion of the exposed part of first gate oxide 40. The remainder of the exposed portion of first gate oxide 40 is stripped with HF.

(e) Strip the patterned photoresist, and grow second gate oxide 42 to a thickness of 400 Å. This oxidation also grows oxide 50 to a thickness of 600 Å on the exposed ends of first polysilicon 13 but not elsewhere due to the masking by nitride 38. See FIG. 3f.

(f) Conformally deposit second polysilicon to a thickness of 3,000 Å by LPCVD. Dope the second polysilicon n+ by phosphorus implantation or diffusion. Spin on photoresist and pattern it to define wordlines 15 which include control gates 14, and use the patterned photoresist as an etch mask to etch second polysilicon plus the nitride, oxide and first polysilicon to form a stack with edges aligned to the edge of wordline 15. Note that the etch removes a portion of substrate 32 located between both the original edges of first polysilicon from step (d) and wordlines 15; see the cross sectional views shown in FIGS. 2b–2d. This completes the device as shown in FIGS. 2a–2d. Note that the use of buried bitlines leads to an essentially planar device which simplifies the processing.

The first embodiment EEPROM may be a CMOS device with the array of cells 10 in the p well or substrate and the peripheral devices such as the row decoder in CMOS; the foregoing description of cell 10 also applies to an NMOS device. Switching doping types and voltage polarities will yield PMOS devices and CMOS devices with the array of cells in the n well.

Figure 4:
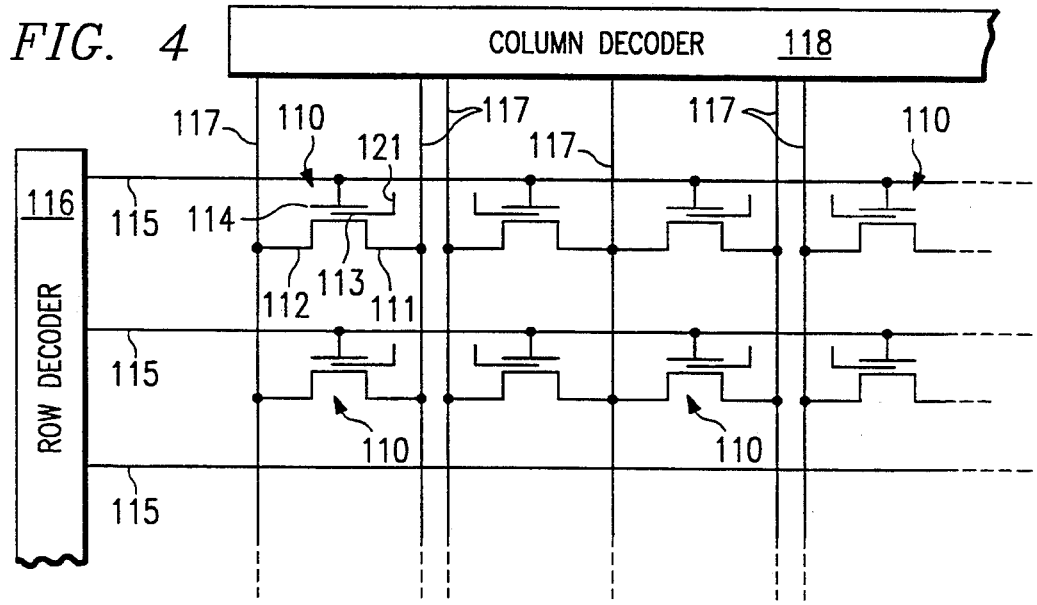
FIG. 4 is a plan view of a portion of a second preferred embodiment Flash EEPROM.

FIG. 4 is a schematic plan view of a second embodiment Flash EEPROM illustrating a portion of the array of memory cells and peripheral devices; the full array may have over a million cells and be fabricated on a silicon substrate of size about 50 $mm^2$. Each cell is a floating gate transistor 110 having a source 111, a drain 112, a floating gate 113, a control gate 114, and an erase node 121. A bit of information is stored in cell 110 by net charge on floating gate 113: with no net charge on floating gate 113 the threshold voltage for cell 110 is low and with a substantial net negative charge on floating gate 113 the threshold voltage is high. The threshold voltage of cell 110 is determined to be high or low simply by applying a control gate 114 voltage and sensing the impedance.

All of the gates 114 in a row of cells are connected to a row address line or wordline 115, and all of the wordlines 115 are connected to a row decoder 116. All of the source and drain electrodes 111 or 112 in a column of cells are connected to a respective column line or bitline 117, and the source and drain bitlines 117 are connected to a column decoder 118. The operation of the second embodiment will be considered in detail in connection with the description of the individual cells infra; however, the following cursory description of the operation provides a convenient overview. To read a selected cell, column decoder 118 applies about +3 volts to the bitline 117 connected to drain 112 of the selected cell and 0 volts to all other bitlines 117, and row decoder 116 applies about +5 volts to the wordline 115 connected to control gate 114 of the selected cell and about 0 volts to all other wordlines 115; thus, all cells except the selected cell and the cell sharing the bitline as drain and the wordline are turned off regardless of any net charges on their floating gates and the selected cell is turned on or off depending upon the net charge on floating gate 113. Thus, the impedance seen by column decoder 118 between the bitline 117 connected to the source of the selected cell and the bitline 117 connected to the drain of the selected cell indicates the bit of information stored by the selected cell. Signals on input lines 119C determine the bitline 117 selection and signals on input lines 119R determine the wordline 115 selection.

Figure 5A:
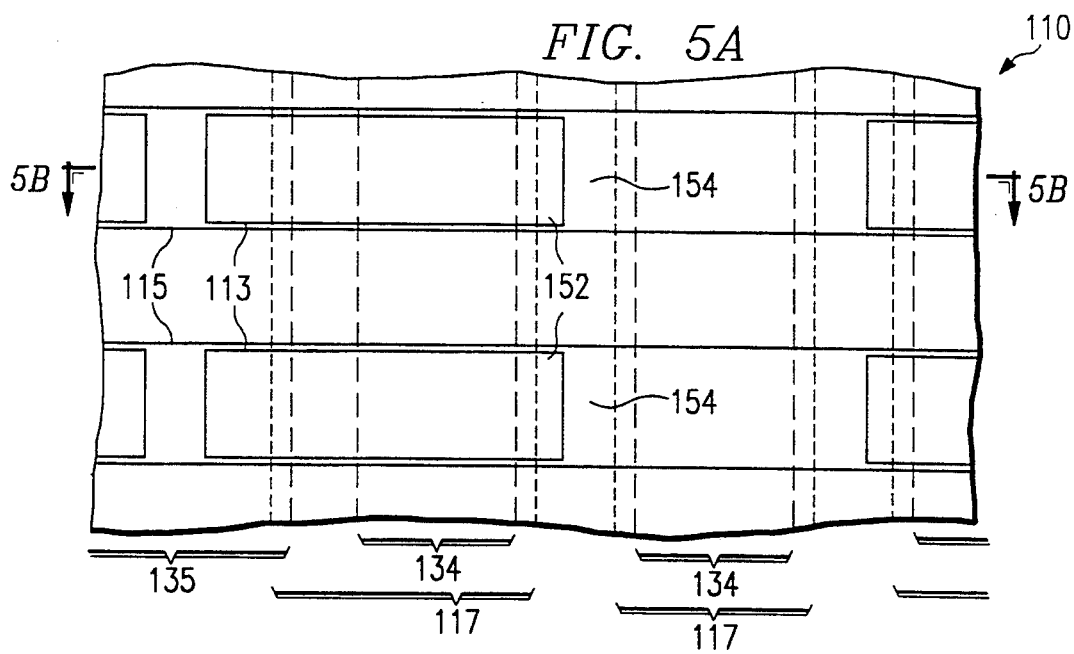
FIGS. 5a-5b are plan and cross sectional elevation views of a second preferred embodiment cell.
Figure 5B:
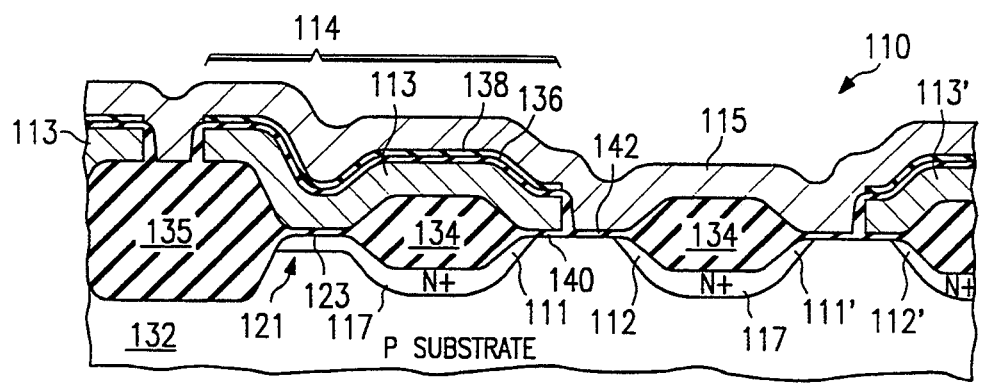

FIGS. 5a–5b are schematic plan and cross sectional elevation views of an individual cell, generally denoted 110, in the second embodiment; passivation, contacts, interconnections, metallizations and packaging have been omitted for clarity. Cell 110 includes p type 100 oriented silicon substrate 132, buried n+ bitlines 117 which provide source 111 and drain 112, field oxide (silicon dioxide) 134, isolation field oxide 135, n+ doped polysilicon (polycrystalline silicon) floating gate 113, interlevel oxide 136, interlevel nitride (silicon nitride) 138, n+ doped polysilicon wordline 115 which provides control gate 114 as indicated in FIG. 5b, first gate oxide 140, second gate oxide 142, and erase tunneling oxide 123. As is apparent from FIG. 5a, cell 110 is a cross-point cell (the cell is at the cross-point of a bitline and a wordline although a field oxide isolation occurs every third bitline) and has the following dimensions expressed in terms of a scalable length $\lambda$: The channel region between source 111 and drain 112 has width $\lambda$ and length $\lambda$, buried bitlines have width $2\lambda$ floating gate 113 has width (vertical distance in FIG. 5a) $\lambda$ and is separated from the adjacent floating gate by $\lambda$, floating gate 113 has length $4\lambda$, the area 152 of the overlap of floating gate 113 on drain region 112 is about $(\frac{1}{3})(\lambda^2)$, the area 154 of the overlap of floating gate 113 on the channel region is also about $(\frac{1}{3})(\lambda^2)$, and the total area of floating gate 113 is about $4\lambda^2$. Thus, cell 110 occupies about $12\lambda^2$. Typically, A would equal about 1 $\mu$m for a 1 Megabit Flash EEPROM, and the oxide and nitride thicknesses supra are convenient for such $\lambda$.

The operation of cell 110 is as follows with voltages given under the presumption of oxide and nitride thicknesses. The region between source 111 and drain 112 comprises a merged transistor with control 114 over floating gate 113 on first gate oxide 140 forming a floating gate transistor and with control gate 114 on second gate oxide 142 forming a select transistor in series with the floating gate transistor. The transistors have their threshold voltages adjusted to about 0.75 volts. Information in cell 110 is stored in terms of whether the merged transistor is turned on by a control gate voltage of 5 volts; the applied drain voltage is 3 volts. If floating gate 113 has a negative net charge sufficient to raise the threshold of the floating gate transistor to above 5 volts, then a control gate voltage of 5 volts is insufficient to turn on the merged transistor; whereas, if floating gate 113 has minimal net charge, then a control gate voltage of 5 volts turns on both transistors. Contrarily, if the control gate voltage is about 0 volts, then the select transistor is off; this compensates for any over erasing of the floating gate transistor which could lower the threshold voltage to below 0 (depletion mode).

In the block erase mode, column decoder 118 applies a voltage of about 0 volts to all bitlines 117. To erase the row of cells or block of cells which includes cell 110, row decoder 116 applies a voltage pulse of about +13 volts to the wordline 115 connected to control gate 114 of the selected row and about 0 volts to all other wordlines 115. This causes tunneling of electrons from bitline 117 through tunneling oxide 123 into floating gate 113 for each cell in he row and results in a block erase. Of course, all rows can be simultaneously erased by applying the voltage pulse to all wordlines and this yields a bulk erase.

In the program mode, column decoder 118 applies a voltage of about +5 volts to the bitline 117 connected to the source of the selected cell and about 0 volts to all other bitlines 117. To perform the programming, row decoder 116 applies a voltage pulse of about −8 volts to the wordline 115 connected to the control gate 114 of the selected cell and about 0 volts to all other wordlines 115. Electrons tunnel out of floating gate 113 through tunneling oxide 123 into source 111 for the selected cell.

Alternatively, hot electrons may be injected into floating gate 113 for programming and tunneling used to remove them for erasure. In this case, a net negative charge on floating gate 113 and the consequent high threshold voltage corresponds to the programmed state, and minimal net charge on floating gate 113 and the consequent low threshold voltage corresponds to the erased state. Thus, cell 110 is erased (reduce net charge on floating gate 113 to minimal levels) together with all other cells in the array by tunneling electrons from floating gate 113 to the bitline 117 containing source 111 under the conditions of 0 volts on all wordlines 115, +15 volts on all bitlines 117 which include sources 111, and floating (disconnecting) bitlines connected to drains 112. The tunneling is driven by the initial potential drop of about +10 volts across the thin tunneling oxide 123.

Cell 110 is programmed (that is, negative net charge is placed on floating gate 13) by avalanche-injecting electrons from source 111 into floating gate 113 under the conditions of +13 volts on wordline 115 which includes control gate 114, 0 volts on all other wordlines, +10 volts on bitline 117 which includes source 111, and 0 volts on all other bitlines. Other cells in the same row are not programmed because the 0 volts on all other bitlines implies no current flowing and no hot electrons; and all other cells in different rows are not programmed because the control gate voltage is 0 volts.

Cell 110 may be fabricated by the first embodiment method with the additional steps of (1) growing isolation oxide 135 prior to the implantation and oxide 134 growth of the analogues of steps (a) and (b) and (2) implanting further arsenic to extend the bitline 117 under tunneling oxide 123, either before the growth of first gate oxide 140 and tunneling oxide 123 or through tunneling oxide 123. Note that this further arsenic implant may be avoided with the tradeoff being a smaller area for erasure tunneling and thus longer erasure times.

Figure 6:
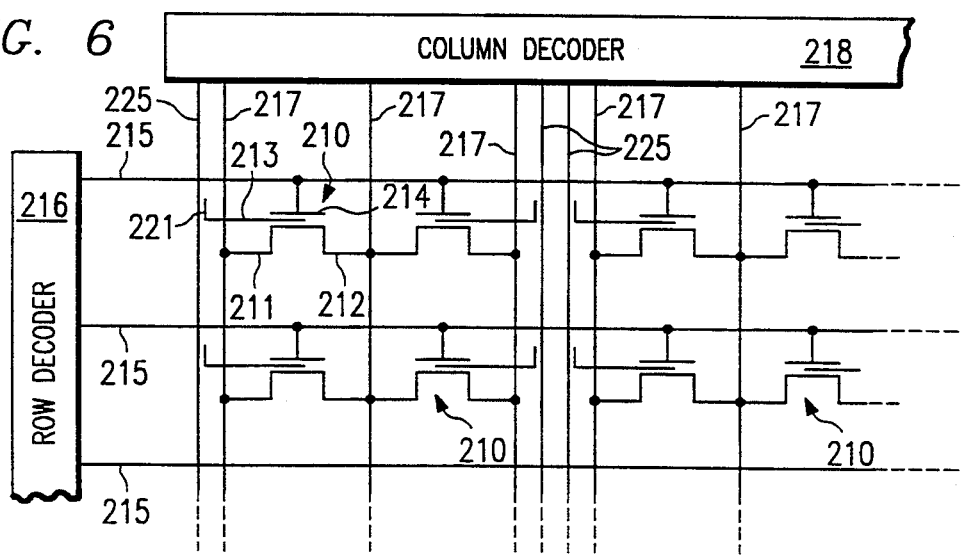
FIG. 6 is a plan view of a portion of a third preferred embodiment Flash EEPROM.

A third embodiment Flash EEPROM is partially shown in schematic plan view in FIG. 6 and includes an array of memory cells and peripheral devices. Each cell is a floating gate transistor 210 having a source 211, a drain 212, a floating gate 213, a control gate 214, and an erase node 221; that is, the same elements as a cell 110. But cell 210 has the erase node 221 on a separate diffusion line 225 and remote from the source bitline 217. All of the gates 214 in a row of cells are connected to a wordline 215, and all of the wordlines 215 are connected to a row decoder 216. All of the sources 211 in a column of cells are in a source bitline 217, all of the drains 212 in a column of cells are in a drain bitline 217, and the source and drain bitlines 217 are connected to a column decoder 218. The erase nodes 221 are all connected to erase lines 225. The operation of the third embodiment is similar to that of the second embodiment and will be considered in detail in connection with the description of the individual cells infra.

FIGS. 7a–7b are schematic plan and cross sectional elevation views of an individual cell, generally denoted 210, in the third embodiment; passivation, contacts, interconnections, metallizations, and packaging have been omitted for clarity. Cell 210 includes p type <100> oriented silicon substrate 232, buried n+ bitlines 217 which provide source 211 and drain 212, field oxide 234, isolation field oxide 235, n+ doped polysilicon floating gate 213, interlevel oxide 236, interlevel nitride 238, n+ doped polysilicon wordline 215 which provides control gate 214 as indicated in FIG. 7b, first gate oxide 240, second gate oxide 242, erase tunneling oxide 223, and buried n+ erase line 225. As is apparent from FIG. 7a, cell 210 is approximately a cross-point cell (the cell is at the crosspoint of a bitline/erase line pair and a wordline) and has the following dimensions expressed in terms of a scalable length $\lambda$: The channel region between source 211 and drain 212 has width and length $2/3\lambda$, buried source bitlines 217 have width $\lambda$, buried drain bitlines 217 have width $2\lambda$, floating gate 213 has width (vertical distance in FIG. 7a) $\lambda$ and is separated from the adjacent floating gate by $\lambda$, floating gate 213 has length $4\lambda$, the area 252 of the overlap of floating gate 213 on drain region 212 is about $(\frac{1}{3})(\alpha^2)$, the area 254 of the overlap of floating gate 213 on the channel region is also about $(\frac{1}{3})(\lambda^2)$, and the total area of floating gate 213 is about $4\lambda^2$. Thus, cell 210 occupies about $12\lambda^2$. Typically, $\lambda$ would equal about 1 $\mu$m for a 1 Megabit Flash EEPROM, and the oxide and nitride thicknesses supra are convenient for such $\lambda$.

The operation of cell 210 is similar to that of cell 110 but with the separate erase line 225 providing additional floating gate 213 potential control which will be apparent infra. As with cells 10 and 110, the region between source 211 and drain 212 comprises a merged transistor with control gate 214 over floating gate 213 on first gate oxide 240 forming a floating gate transistor and with control gate 214 on second gate oxide 242 forming a select transistor in series with the floating gate transistor. The transistors have their threshold voltages adjusted to about 0.75 volts. Information in cell 210 is stored in terms of whether the merged transistor is turned on by a control gate voltage of 5 volts; the applied drain voltage is 3 volts. If floating gate 213 has a negative net charge sufficient to raise the threshold of the floating gate transistor to above 5 volts, then a control gate voltage of 5 volts is insufficient to turn on the merged transistor; whereas, if floating gate 213 has minimal net charge, then a control gate voltage of 5 volts turns on both transistors. Contrarily, if the control gate voltage is about 0 volts, then the select transistor is off; this compensates for any over erasing of the floating gate transistor which could lower the threshold voltage to below 0 (depletion mode). During this read of cell 210, erase line 225 is held at 5 volts to raise the potential of floating gate 213.

In the block erase mode, column decoder 218 applies a voltage of about 0 volts to all bitlines 217, to erase the row of cells or block of cells which includes cell 210, row decoder 216 applies a voltage pulse of about +13 volts to the wordline 215 connected to control gate 214 of the selected row and about 0 volts to all other wordlines 215. This causes tunneling of electrons from bitline 217 through tunneling oxide 123 into floating gate 213 for each cell in the row and results in a block erase. Of course, all rows can be simultaneously erased by applying the voltage pulse to all wordlines and this yields a bulk erase.

In the program mode, column decoder 218 applies a voltage of about +5 volts to the bitline 217 connected to the source of the selected cell and about 0 volts to all other bitlines 217. To perform the programming, row decoder 216 applies a voltage pulse of about −8 volts to the wordline 215 connected to the control gate 214 of the selected cell and about 0 volts to all other wordlines 215. Electrons tunnel out of floating gate 213 through tunneling oxide 223 into source 211 for the selected cell.

Alternatively, hot electrons may be injected into floating gate 213 for programming and tunneling used to remove them from erasure. In this case, a net negative charge on floating gate 312 and the consequent high threshold voltage corresponds to the programmed state, and minimal net charge on floating gate 213 and the consequent low threshold voltage corresponds to the erased state. Thus, cell 210 is programmed (put negative net charge on floating gate 213) by avalanche-injecting electrons from source 211 into floating gate 213 under the conditions of +13 volts on wordline 215 which includes control gate 214, 0 volts on all other wordlines, +10 volts on bitline 217 which includes source 211, 1 volt on all other bitlines (which includes the bitline with drain 212), and 5 volts on erase line 225. The 5 volt bias on erase line 225 raises the potential of floating gate 213 and improves charge collection. Other cells in the same row are not programmed because the 1 volt on all other bitlines implies no hot electrons; and all other cells in different rows are not programmed because the control gate voltage is 0 volts.

Cell 210 is erased (i.e., net charge on floating gate 213 is reduced to minimal levels) together with all other cells in the array by tunneling electrons from floating gate 213 into the erase lines 225 under the conditions of 0 volts on all wordlines 115, +15 volts on all erase lines 225, and floating (disconnecting) all bitlines 217. The tunneling is driven by the initial potential drop of about +10 volts across the thin tunneling oxide 223.

FIG. 8 is a schematic plan view of a fourth embodiment Flash EEPROM illustrating a portion of the array of memory cells and peripheral devices; the full array may have over four million cells and be fabricated on a silicon substrate of a size of about 50 mm$^2$. Each cell is a floating gate transistor 310 having a source 311, a drain 312, a channel area 313 separating source 311 and drain 312, a floating gate 314, and a control gate 315. A bit of information is stored in cell 310 by the presence of net charge on floating gate 314: with no net charge on floating gate 314, the threshold voltage for cell 310 is low indicating a logic "1" and with substantial net negative charge on floating gate 314, the threshold voltage is high indicating a logic "0". The threshold voltage of cell 310 is determined to be high or low simply by applying a voltage to control gate 315, and sensing the impedance between source 311 and 312. All of the gates 315 in a row of cells form a row address wordline 316, and all the wordlines 316 are connected to a row decoder 317. All the source and drain electrodes 311 or 312 in a column of cells form a pair of bitlines 318; the source and drain bitlines 318 are connected to a column decoder 319. In the array configuration, channel areas 313 are elongated in a column direction separating the sources 311 and drain 312 included in each column of cells.

The operation of the fourth embodiment will be considered in detail in connection with the description of the individual cells, infra; however, the following cursory description of the operation provides a convenient overview. In the operation of the fourth embodiment, the erased state is that state when no net charge or a net positive charge resides on floating gate 314, and the programmed state is that state when substantial net negative charge resides on floating gate 314.

To read a selected cell, column decoder 319 applies about +1 volt to the bitline 318 including the drain 312 of the selected cell, and 0 volts to all other bitlines 318, and row decoder 317 applies about +5 volts to the wordline 316 including the control gate 315 of the selected cell, and about 0 volts to all other wordlines 316. The selected cell is turned on or off, depending on the net charge on floating gate 314. Thus, the impedance seen by column decoder 319 between bitlines 318 including the source 311 of the selected cell, and the bitline 318 connected to the drain 312 of the selected cell, indicates the bit of information stored by the selected cell. All other cells 310 in the array are turned off regardless of any net charges on their floating gates. Signals on input lines 320c determine the bit line 318 selection and signals on input lines 320r determine the wordline 316 selection.

Figure 8A:
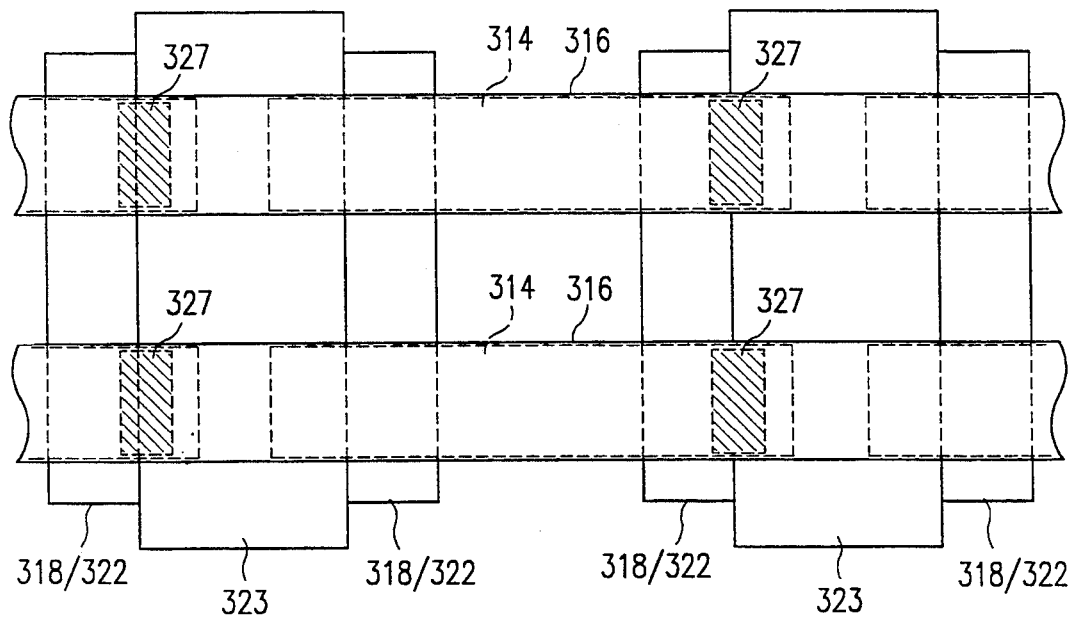
FIG. 8a is a plan view of the fourth preferred embodiment cell.
Figure 8B:
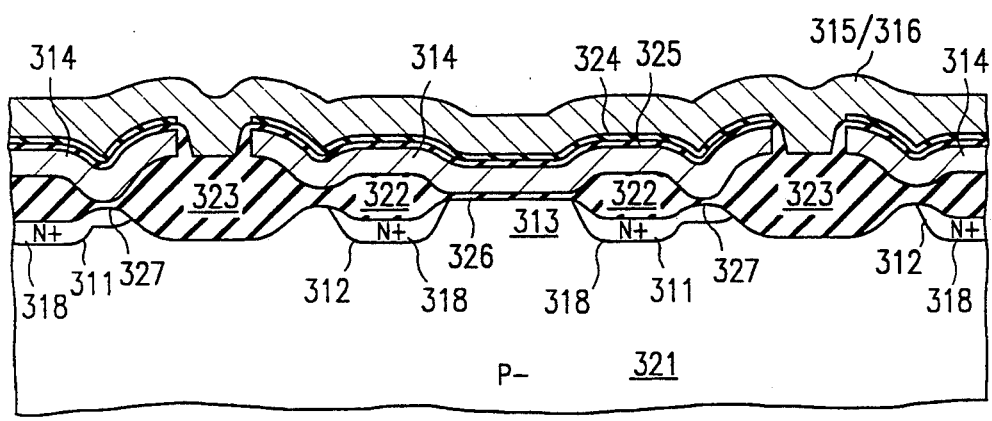

FIGS. 8a–8b are schematic plan and cross-sectional elevational views of an individual cell, generally denoted 310, in the fourth embodiment; passivation, contacts, interconnections, metallizations, and packaging have been omitted for clarity. Cell 310 includes p-type <100> oriented silicon substrate 321, buried n+ bitlines 318 which provide source 311 and drain 312, field oxide 322, thick isolation field oxide 323, n+ doped polysilicon floating gate 314, interlevel oxide 324, interlevel nitride 325, n+ doped polysilicon wordline 316, which provides control gate 315 as indicated in FIG. 8b, gate oxide 326 and tunneling oxide window 327. Cell 310 is known in the art as an "1T" cell in which the entire length of channel 313 between source 311 and drain 312 underlies floating gate 314. The merged pass gate forming a select transistor over the channel area has been eliminated.

As is apparent from FIG. 8a, cell 310 is approximately a cross-point cell (the cell is at the crosspoint of a bitline pair and a wordline), and has the following dimensions expressed in terms of a schaleable length $\lambda$: The channel region 313 between source 311 and drain 312 has width 0.8$\lambda$ and length 0.9$\lambda$, buried source bitlines 318 have width 0.9 $\lambda$, buried drain bitlines 318 have width 0.9 $\lambda$, floating gate 314 has width (vertical distance in FIG. 8a) 0.9 $\lambda$, and is separated from adjacent floating gates 314 by 0.9 $\lambda$, floating gate 314 has a length of approximately 3.5$\lambda$, the area of overlap of the floating gate 314 on drain region 312 is about 0.8$\lambda^2$ the area of the overlap of floating gate 314 on the channel region is about 0.7 $\lambda^2$ and the total area of floating gate 314 is about 3 $\lambda^2$. Thus, cell 310 occupies about 8.6$\lambda^2$. Typically, $\lambda$ would equal about 1 $\mu$m for a four megabit Flash EEPROM, and the oxide and nitride thicknesses supra are convenient for such $\lambda$.

The operation of cell 310 is similar to that of cell 10 and cell 110, however, unlike cells 10 and 110, cell 110 does not comprise a merged transistor. In cell 310, floating gate 314 overlies and controls the entire channel area 313 between source 311 and drain 312. The select transistors found in cells 10 and 110 have been eliminated. Cell 310 has its threshold voltage with an uncharged floating gate 314 adjusted to about 0.75 volts. Information in cell 310 is stored in terms of whether the single cell is turned on by a control gate voltage of 5 volts, while one volt is applied to the drain 312 and 0 volts are applied to the source 311. If the floating gate 314 has a negative net charge sufficient to raise the threshold of the floating gate transistor to above 5 volts, then a control gate voltage of 5 volts is insufficient to turn on the single cell transistor, whereas if floating gate 314 has minimal net charge, then a control gate voltage of 5 volts turns on the transistor.

To erase a row of cells which includes cell 310, row decoder 317 applies a voltage pulse of about −11 volts to the wordline 316 including the control gate 315 of the selected row, and about +5 volts to all other wordlines 316. Column decoder 319 applies a voltage of about 5 volts to all bitlines 318 including the sources 311 and allows bitlines 318 including the drain regions 312 to float. This causes tunneling of electrons from floating gates 314 along the selected wordline 316 through tunneling oxide window 327 to source 312 for each cell in the row, resulting in a row erase. Of course, all rows can be simultaneously erased by applying the voltage pulse to all wordlines.

In the program mode, column decoder 319 applies a voltage of about 18 volts to the bitline 318 including the source 311 of the selected cell, about 7 volts to the bitlines 318 including the remaining sources 311 and about 0 volts to the bitline 318 including the drain 312 of the selected cell. All bitlines 318 including the remaining drains 312 are allowed to float. Row decoder 317 applies a voltage pulse of about 18 volts to the wordline 316 including the control gate 315 of the selected cell, and about 7 volts to the other wordlines 316. Electrons tunnel out of selected source 311 through tunneling oxide window 327 onto floating gate 314 of the selected cell.

Figure 8C:
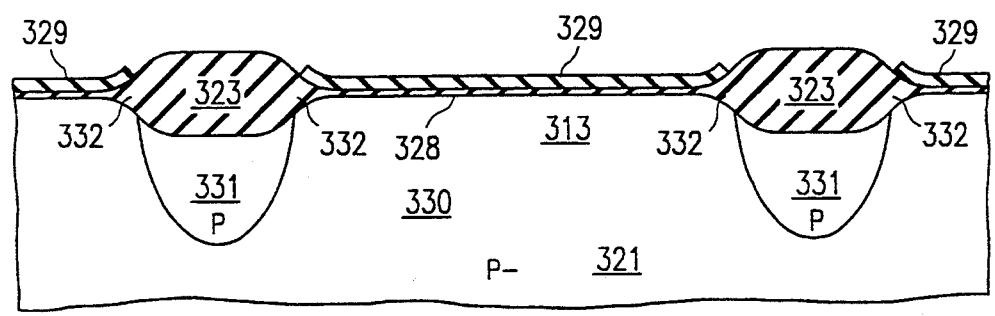
FIGS. 8c-8e are cross-sectional elevation views of a preferred method of fabrication of the fourth preferred embodiment, corresponding to FIG. 8b but drawn more diagrammatically for clarity.

Cell 310 may be fabricated in a fashion similar to that of cell 10 in the first embodiment method. In a preferred fabrication method, however, a major difference in the processing method occurs during the formation of tunneling oxide window 327. This method can best be described by referring to FIGS. 8c–8d. Referring to FIG. 8c, a layer 328 of oxide is deposited or grown on the surface of substrate layer 321. This is followed by the deposition of a nitride layer 329 on top of the oxide layer 328. The nitride layer 329 is patterned and etched to define an active device area 330 for which it resides, which will later include source region 311, drain region 312 and a channel region 313 of the cell.

A boron implant at a dose of approximately $8 \times 10^{12}$ cm$^{-2}$ is performed to create (p) channel stop regions 331. Then, isolation oxides 323 are thermally grown using a localized oxidation process to a thickness of approximately 9000 Å by exposing the substrate to steam at about 900° C. for several hours, using any of several conventional techniques. Isolation oxides 323 grow beneath the edges of adjacent nitride layers 329, creating birds' beaks 332 instead of sharp transitions.

Figure 8D:
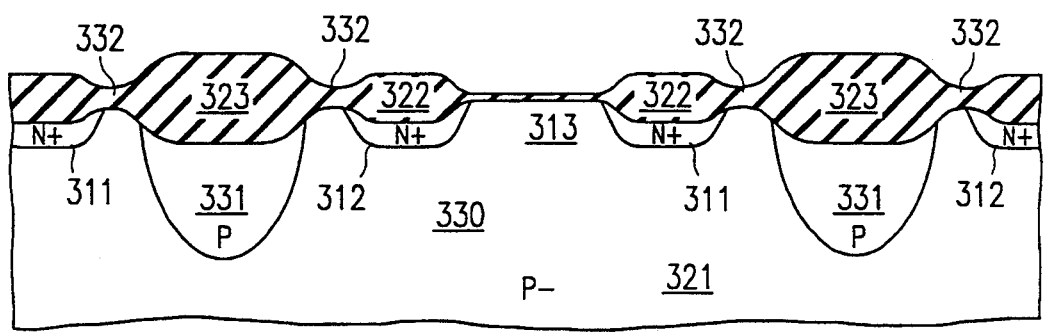

Referring next to FIG. 8d, nitride layer 329 and oxide layer 328 are removed. A layer (not shown) of photoresist is deposited and patterned to act as implant mask for an arsenic implant at a dose of approximately $6 \times 10$ cm$^2$, and at an energy of about 130 keV. This implant creates source region 311 and drain region 312, spaced by channel area 313.

Following the implant of the source 311 and the drain 312, another thermal step is performed with steam at 800° to 900° C. to differentially grow field oxides 322. Oxides 322 will be grown to a thickness of approximately 2500 to 3500 Å. At the same time, a thinner oxide layer 333 is formed across the channel and may have a thickness of approximately 200 to 300 Å. Oxide regions 322 grow at a faster rate than the thin oxide layer 333 because of the arsenic impurity in the source and drain regions 311 and 312. Regions 322 are sometimes denoted as being differentially grown because their thickness is a positive function of the amount of arsenic impurity.

Figure 8E:
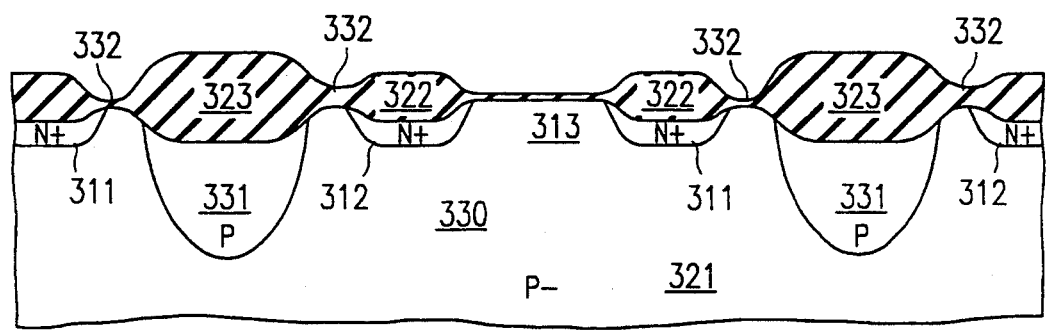

Referring next to FIG. 8e, tunneling oxide windows 327 are next formed in the oxide in the transition areas 332 adjacent the source 311. This is done by etching through the oxide over the transition area 332 to the silicon using photoresist as a mask, and then regrowing thinner tunneling oxides 327 which are approximately 100 Å thick. At the time that this oxidation occurs, the oxide layer 333 will go to approximately 350 Å depending on its thickness before this step. A light phosphorus implant is preferably performed through the tunnel oxide 327 to improve the field plate breakdown of the tunnel diode and the operations of the cell. The width of the tunnel oxide window 327 may be controlled by varying the length of time for the etch through transition areas 332.

The method of forming tunneling oxide window 327 uses the relatively thin "dimple" or transition region between thick isolating oxide 323 and differentially grown field oxide 322 to self-align the etch that opens a window through the oxide. This eliminates the need for the photoresist mask to be critically aligned in order to obtain a precisely defined window.

Following the formation of tunneling oxide windows 327, the processing continues in a manner similar to the fabrication of cell 10, beginning with the formation and definition of floating gate conductor 314. Since the details of this processing have been essentially discussed for the fabrication of cell 10, the details will not be repeated here.

Various modifications of the preferred embodiment devices and methods may be made while retaining the features of buried source and drain lines and remote substrate erase lines which provide a planar topography and limited use of metal lines, large floating gate capacitive coupling to the control gate for low voltage operation, and cross-point layout for high packing density with a merged transistor and electrical programming and erasure from polysilicon floating gate to an underlying diffusion line. For example, the dimensions and shapes of the cells could be varied such as having the buried lines and/or the wordlines bulging or sinuous rather than uniform and straight, having the wordlines silicided, using other semiconductor materials or silicon-on-insulator type substrates, and using the insulator materials.

The invention provides the advantages of high packing density and simple fabrication processing.

Although the present invention has been described in detail, it should be understood that various changes, substitutions and alterations can be made herein without departing from the spirit and scope of the invention as defined by the appended claims.

What is claimed is:

1. An electrically-erasable, electrically-programmable read-only memory cell formed at a face of a semiconductor layer of a first conductivity type, comprising:
   a first doped region of a second conductivity type opposite that of said first conductivity type, formed at said face;
   a second doped region of said second conductivity type formed at said face and spaced from said first doped region by a channel region;
   a first insulator region overlying said first doped region;
   a thick insulator region overlying and abutting said semiconductor layer of said first conductivity type, said thick insulator region spaced from said channel region by said first insulator region, a relatively thin transition insulator region disposed between said first insulator region and said thick insulator region;
   a tunneling oxide window formed in said transition insulator region;
   a floating gate conductor formed insulatively overlying at least a portion of said channel region between said first and second doped regions, and adjoining said tunneling oxide window; and
   a control gate conductor insulatively overlying said floating gate conductor.

2. The memory cell of claim 1, wherein said first insulator region and said thick insulator region are formed of oxide.

3. The memory cell of claim 1, wherein said floating gate extends over said first insulator region.

4. The memory cell of claim 3, wherein said floating gate extends over at least a portion of said thick insulator region adjacent said first doped region.

5. The memory cell of claim 1, and further comprising a second insulator region overlying said second doped region.

6. The memory cell of claim 5, wherein said floating gate extends over at least a portion of said second insulator region.

7. The memory cell of claim 5 and further comprising a second thick insulator region adjacent said second doped region.

8. The memory cell of claim 7, wherein said floating gate extends over at least a portion of said second thick insulator region.

9. The memory cell of claim 7 wherein said second thick insulator region does not overlie said second doped region.

10. The memory cell of claim 1 and further comprising a channel stop region of said first conductivity type formed in said semiconductor layer beneath said thick insulator region.

11. The memory cell of claim I wherein said first doped region comprises a source region and said second doped region comprises a drain region.

12. An array of electrically-erasable, electrically-programmable read-only memory cells formed in columns and in rows at an angle to said columns, and at a face of semiconductor layer of a first conductivity type, comprising:
   for each column, an elongated drain region of a second conductivity type opposite said first conductivity type, forming a first bitline;
   for each column, an elongated source region of said second conductivity type, said source region forming a second bitline substantially in parallel to said first bitline and spaced therefrom by an elongated channel, a respective portion of said channel associated with each cell in the column, a length of said channel defined between said elongated source and drain regions;
   for each column, a first differentially grown insulator region overlying said elongated source region;

for each column, a first thick insulator region adjacent said source region formed spaced from said channels in said column, by said first differentially grown insulator region, said thick insulator region isolating said column of cells from an adjacent column of cells;

a thinner transition region formed between said differentially grown insulator region formed overlying said respective elongated source region and said thick insulator region formed adjacent said respective elongated source region;

for each cell, a tunneling oxide window adjacent a portion of a respective elongated source region, and formed in a portion of said thinner transition region;

for each cell, a floating gate insulatively adjacent at least a portion of said length of said channel between said source region and said drain region in the direction of said rows, and adjoining said tunneling oxide window; and for each row, a control gate insulatively overlying said floating gates in said row.

13. The array of claim 12, wherein said floating gate extends over at least a portion of said differentially grown insulator region.

14. The array of claim 13, wherein each said floating gate extends over a respective portion of said thick insulator region formed adjacent said elongated source regions.

15. The array of claim 12, and further comprising, for each column, a differentially grown insulator region formed over said elongated drain region, floating gates in said column extending at least partly over said differentially grown insulator region.

16. The array of claim 12, and further comprising, for each column, a second thick insulator region formed adjacent said elongated drain region in said column and remote from said channels in said column, floating gates in said column extending at least partially over said second thick insulator region.

17. A non-volatile memory cell comprising:
a semiconductor layer of a first conductivity type;
a first doped region formed in said semiconductor layer, said first doped region of a second conductivity type opposite said first conductivity type;
a second doped region formed in said semiconductor layer and spaced from said first doped region by a channel region, said second doped region of said second conductivity type;
a first insulator region formed over said first doped region;
a second insulator region formed over said second doped region;
a third insulator region formed over a region of said semiconductor layer doped to said first conductivity type, said third insulator adjacent said first doped region;
a tunnel region formed over said first doped region between said first and third insulator regions;
a fourth insulator region formed over a region of said semiconductor layer of said first conductivity type, said fourth insulator adjacent said second doped region;
a floating gate overlying said tunnel region, said first insulator region, said gate insulator, and said second insulator region and at least partially overlying said third and fourth insulator regions; and
a control gate at least partially overlying said floating gate and insulated therefrom.

18. The cell of claim 17 wherein said first and second doped regions comprise n-doped silicon and said channel region comprises p-doped silicon.

19. The cell of claim 17 wherein said third insulator region is thicker than said first insulator region and said fourth insulator region is thicker than said second insulator region.

20. The cell of claim 17 wherein said first, second, third, and fourth insulator regions comprise oxide regions.

21. The cell of claim 17 wherein said control gate comprises polysilicon.

22. The cell of claim 17 wherein said floating gate comprises polysilicon.

23. The cell of claim 17 and further comprising channel stop regions formed in said semiconductor layer beneath said third and fourth insulator regions.

* * * * *

UNITED STATES PATENT AND TRADEMARK OFFICE
CERTIFICATE OF CORRECTION

PATENT NO. : 5,394,002
DATED : February 28, 1995
INVENTOR(S) : James L. Paterson It is certified that error appears in the above-indentified patent and that said Letters Patent is hereby corrected as shown below:

On the title page item [75], "Peterson" should read —Paterson—.

Signed and Sealed this

Eleventh Day of July, 1995

Attest:

BRUCE LEHMAN

Attesting Officer

Commissioner of Patents and Trademarks